United States Patent
King et al.

(10) Patent No.: US 10,230,012 B2
(45) Date of Patent: Mar. 12, 2019

(54) CONCENTRATOR PHOTOVOLTAIC CELLS BONDED TO FLAT-PLATE SOLAR CELLS FOR DIRECT AND OFF-AXIS LIGHT COLLECTION

(71) Applicant: THE BOEING COMPANY, Chicago, IL (US)

(72) Inventors: Richard R. King, Chicago, IL (US); Philip T. Chiu, Chicago, IL (US); Nasser H. Karam, Chicago, IL (US)

(73) Assignee: The Boeing Company, Chicago, IL (US)

( * ) Notice: Subject to any disclaimer, the term of this patent is extended or adjusted under 35 U.S.C. 154(b) by 229 days.

(21) Appl. No.: 14/838,174

(22) Filed: Aug. 27, 2015

(65) Prior Publication Data

US 2017/0062630 A1    Mar. 2, 2017

(51) Int. Cl.
*H01L 31/02*      (2006.01)
*H01L 31/05*      (2014.01)
(Continued)

(52) U.S. Cl.
CPC .......... *H01L 31/043* (2014.12); *H01L 27/142* (2013.01); *H01L 31/02008* (2013.01); *H01L 31/02325* (2013.01); *H01L 31/022425* (2013.01); *H01L 31/046* (2014.12); *H01L 31/0465* (2014.12); *H01L 31/0504* (2013.01);
(Continued)

(58) Field of Classification Search
CPC ....... H01L 31/02325; H01L 31/022425; H01L 31/043; H01L 31/046; H01L 31/0465; H01L 31/0543; H01L 27/142; Y02E 10/52
See application file for complete search history.

(56) References Cited

U.S. PATENT DOCUMENTS

2002/0148497 A1* 10/2002 Sasaoka .................. F24J 2/067
                                                                   136/243
2008/0048102 A1* 2/2008 Kurtz .................. H01L 31/0547
                                                                  250/226

(Continued)

OTHER PUBLICATIONS

Haney, Michael W., Tian Gu, and Gautam Agrawal. "Hybrid microscale CPV/PV architecture." Photovoltaic Specialist Conference (PVSC), 2014 IEEE 40th. IEEE, 2014.*

(Continued)

*Primary Examiner* — Lindsey A Bernier
(74) *Attorney, Agent, or Firm* — Haynes and Boone, LLP

(57) ABSTRACT

Systems, methods, and apparatus for light collection and conversion to electricity are disclosed herein. The disclosed method involves receiving, by at least one concentrating element (e.g., a lens), light from at least one light source, where the light comprises direct light and diffuse light. The method further involves focusing, by at least one concentrating element, the direct light onto at least one concentrator photovoltaic cell. Also, the method involves passing, by at least one concentrating element, the diffuse light onto at least one solar cell of an array of solar cells arranged on a flat plate, where at least one concentrator photovoltaic cell is bonded on top of at least one of the solar cells in the array. In addition, the method involves collecting, by at least one concentrator photovoltaic cell, the direct light. Further, the method involves collecting, by at least one solar cell, the diffuse light.

20 Claims, 5 Drawing Sheets

(51) Int. Cl.
*H01L 27/142* (2014.01)
*H01L 31/043* (2014.01)
*H01L 31/046* (2014.01)
*H01L 31/054* (2014.01)
*H01L 31/068* (2012.01)
*H01L 31/0224* (2006.01)
*H01L 31/0232* (2014.01)
*H01L 31/0465* (2014.01)
*H01L 31/0693* (2012.01)

(52) U.S. Cl.
CPC ........ *H01L 31/0543* (2014.12); *H01L 31/068* (2013.01); *H01L 31/0693* (2013.01); *Y02E 10/52* (2013.01); *Y02E 10/544* (2013.01); *Y02E 10/547* (2013.01)

(56) References Cited

U.S. PATENT DOCUMENTS

| | | | | |
|---|---|---|---|---|
| 2010/0083999 A1* | 4/2010 | Hovel | ............. | B82Y 20/00 |
| | | | | 136/244 |
| 2011/0277820 A1* | 11/2011 | Ho | ............. | H01L 27/1421 |
| | | | | 136/249 |
| 2016/0099674 A1* | 4/2016 | Pan | ............. | H02S 40/22 |
| | | | | 136/246 |

OTHER PUBLICATIONS

Michael W. Haney, et al., "Hybrid Micro-scale CPV/PV Architecture", 978-1-4799-4398-2/14, pp. 2122-2126, IEEE, 2014.

* cited by examiner

Calculated energy production and cost metrics of the proposed hybrid modules.

| | | Conventional Flat-Plate Silicon System | Hybrid CPV and Flat-Plate Si System |
|---|---|---|---|
| DC power per m² collector area from direct light | W/m² | 120 | 233 |
| DC power per m² collector area from diffuse light | W/m² | 80 | 77 |
| Total DC power per m² collector area | W/m² | 200 | 310 |
| Solar energy harvesting efficiency | | 20% | 31% |
| Cell cost per m² collector area | $/m² | 70 | 99 |
| Module cost excl. cells per m² collector area | $/m² | 30 | 49 |
| Total module production cost per m² collector area | $/m² | 100 | 148 |
| BOS cost per m² collector area | $/m² | 300 | 300 |
| Total system cost per m² collector area incl. BOS | $/m² | 400 | 448 |
| Total cost per watt | $/W | 2.00 | 1.44 |

FIG. 2

CONCENTRATOR PHOTOVOLTAIC CELLS BONDED TO FLAT-PLATE SOLAR CELLS FOR DIRECT AND OFF-AXIS LIGHT COLLECTION

FIELD

The present disclosure relates to concentrator photovoltaic cells. In particular, it relates to concentrator photovoltaic cells bonded to flat-plate solar cells for direct and off-axis light collection.

BACKGROUND

There is a fundamental tradeoff in photovoltaics between (1) flat-plate systems, which can collect both direct and diffuse (off-axis) components of sunlight but require a large area of semiconductor material, and (2) concentrator systems, which use small areas of very high-efficiency solar cells, but typically use only the direct component of sunlight. It should be noted that concentrator systems must also be pointed very accurately at the sun or other light source, and off-axis light outside of a certain acceptance cone is typically wasted. In addition, high-efficiency multijunction III-V cells commonly need to be mounted in a costly, labor-intensive process in discrete receivers.

Currently, flat-plate photovoltaic systems use a large amount of semiconductor area, thereby restricting the type of solar cells used in flat-plate systems to low-cost, relatively low-efficiency cells, such as silicon flat-plate cells. Concentrator photovoltaic (CPV) systems allow small-area, high-efficiency multijunction III-V cells to be used economically, but typically use only the direct portion of the solar spectrum. Depending on the location, approximately 15 to 40 percent of the energy in sunlight may be diffuse, causing this energy to be lost to CPV systems. The power output of standard CPV systems, whether for terrestrial or space applications, or solar, laser power, or other applications, drops to near zero for off-axis light, whether that light is diffuse light from well outside the sun's disk, or light from the main light source that is off-axis relative to the CPV optics due to misalignment of the CPV optics. Additionally, packaging III-V cells in discrete packages is slow and costly.

As such, there is need for an improved photovoltaic system and method to collect both direct light and diffuse light.

SUMMARY

The present disclosure relates to a method, system, and apparatus for concentrator photovoltaic cells bonded to flat-plate solar cells for direct and off-axis light collection. In one or more embodiments, a method for light collection and conversion to electricity involves receiving, by at least one concentrating element (e.g., a lens or other primary optical concentrating element), light from at least one light source, wherein the light comprises direct light and diffuse light. The method further involves focusing, by at least one concentrating element the direct light onto at least one concentrator photovoltaic cell. Also, the method involves passing, by at least one concentrating element, the diffuse light onto at least one solar cell of an array of solar cells arranged on a flat plate, where at least one concentrator photovoltaic cell is bonded on top of at least one of the solar cells in the array. In addition, the method involves collecting, by at least one concentrator photovoltaic cell, the direct light. Also, the method involves collecting, by at least one solar cell, the diffuse light. Additionally, the method involves converting, by at least one concentrator photovoltaic cell, the direct light into electrical energy. Further, the method involves converting, by at least one solar cell, the diffuse light into electrical energy.

In one or more embodiments, at least one concentrating element is a lens parquet. In at least one embodiment, at least one concentrator photovoltaic cell is manufactured from at least one III-V material. In some embodiments, the III-V material is GaInP, AlGaInP, GaAs, AlGaAs, AlGaInAs, GaInPAs, GaInN, AlGaInN, (Al)GaInP/Ga(In)As two junction (2J), AlGa(In)As/Ga(In)As 2J, AlGaInP/AlGaAs/AlGaInAs three junction (3J), and/or AlGaInP/GaInP/AlGaAs/GaInAs four junction (4J).

In at least one embodiment, at least one concentrator photovoltaic cell comprises multiple layers, where the multiple layers comprise a conduction layer and at least two cell layers. In some embodiments, at least one concentrator photovoltaic cell comprises at least two terminals, where a first end of each of at least two terminals is connected to the conduction layer and a second end of each of at least two terminals is connected to at least one metal gridline, where at least one metal gridline is configured on top of at least one of the solar cells in the array.

In one or more embodiments, at least one concentrator photovoltaic cell is bonded on top of at least one of the solar cells by utilizing a bonding that is transparent or opaque. In one or more embodiments, when at least one concentrator photovoltaic cell is bonded on top of at least one of the solar cells by utilizing a bonding that is transparent, the method further involves collecting, by at least one solar cell, the direct light.

In some embodiments, at least one concentrator photovoltaic cell is bonded on top of at least one of the solar cells by utilizing a bonding that is a conductor or an insulator.

In at least one embodiment, the low bandgap solar cells in the array are manufactured from Si, Ge, SiGe, GaInNAs, metamorphic GaInAs, lattice-matched GaInAs, GaInPAs, AlGaInAs, metamorphic GaInAs/Ge two junction (2J), Ge/Ge 2J, GaInPAs/GaInAs 2J, and/or AlGaInAs/GaInAs 2J.

In one or more embodiments, a system for light collection and conversion to electricity involves at least one concentrating element to receive light, which comprises direct light and diffuse light, from at least one light source. At least one concentrating element is further to focus the direct light onto at least one concentrator photovoltaic cell. Also, at least one concentrating element is to pass the diffuse light onto at least one solar cell of an array of solar cells arranged on a flat plate. The system further involves at least one concentrator photovoltaic cell to collect the direct light, and to convert the direct light into electrical energy. Further, the system involves at least one solar cell to collect the diffuse light, and to convert the diffuse light into electrical energy.

In at least one embodiment, at least one concentrator photovoltaic cell comprises at least two terminals, where a first end of each of the at least two terminals is connected to the conduction layer and a second end of each of at least two terminals is connected to at least one metal gridline, where at least one metal gridline is configured on top of at least one of the solar cells in the array.

In one or more embodiments, a method for manufacturing a system for light collection and conversion to electricity involves arranging an array of solar cells on a flat plate. The method further involves bonding at least one concentrator photovoltaic cell on top of at least one of the solar cells in the array. Also, the method involves configuring at least one metal gridline on top of at least one of the solar cells in the array. In addition, the method involves connecting each of at least one concentrator photovoltaic cells to at least one of at least one metal gridline. Further, the method involves configuring at least one concentrating element above the array of solar cells.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

FIG. 2 is a table showing the calculated energy production and cost metrics of the disclosed system for concentrator photovoltaic cells bonded to flat-plate solar cells for direct and off-axis light collection, in accordance with at least one embodiment of the present disclosure.

DESCRIPTION

Figure 1:
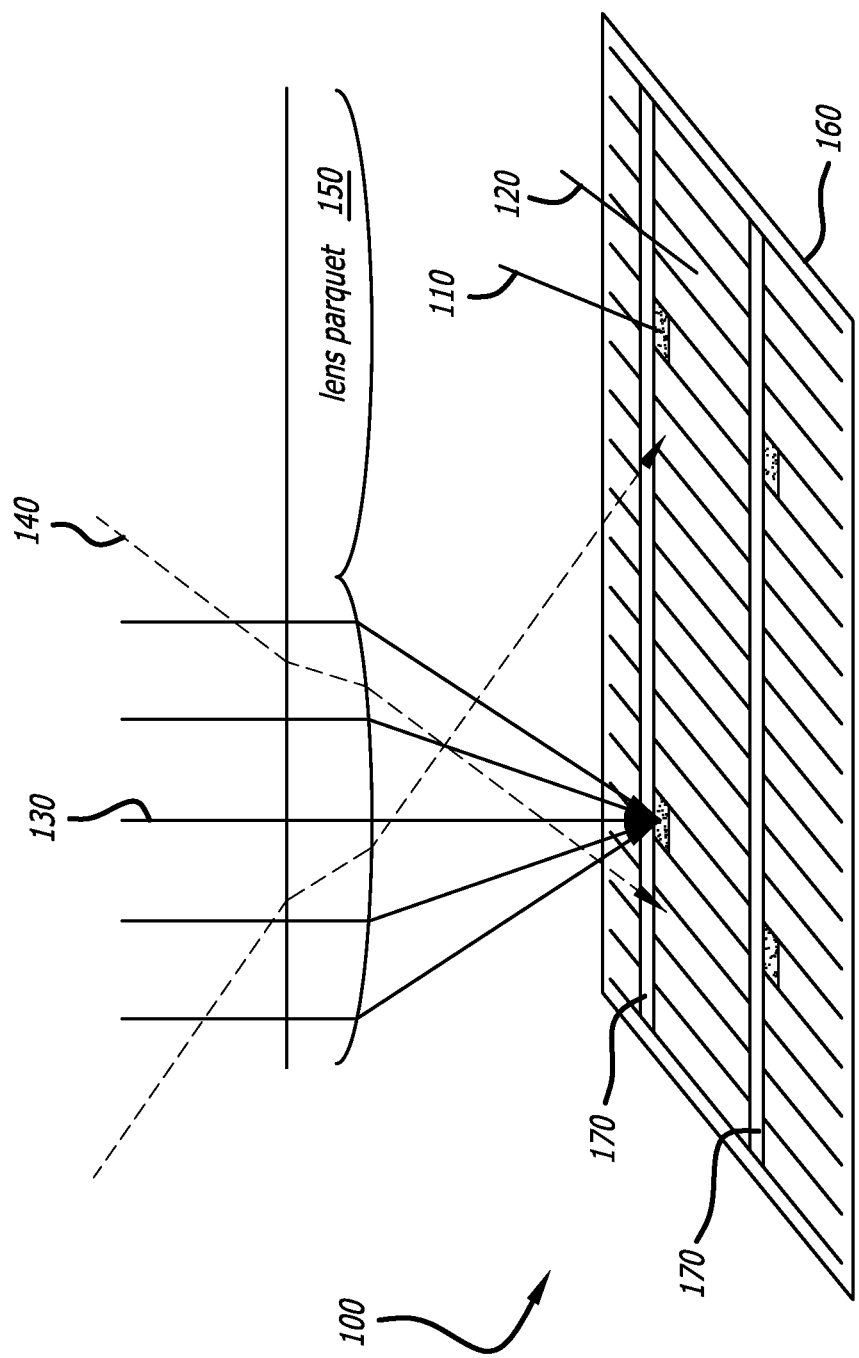
FIG. 1 is a diagram depicting the disclosed system for concentrator photovoltaic cells bonded to flat-plate solar cells for direct and off-axis light collection, in accordance with at least one embodiment of the present disclosure.

The methods and apparatus disclosed herein provide an operative system for concentrator photovoltaic cells bonded to flat-plate solar cells for direct and off-axis light collection. The system of the present disclosure employs multiple concentrator photovoltaic (CPV) solar cells that are mounted or bonded in an array on a photoactive, large-area silicon solar cell platform, such that direct sunlight incident on an array of primary concentrators, such as lenses, is focused on the array of CPV cells, while diffuse sunlight, which is lost in conventional CPV systems, is also collected by the large-area silicon cell covering the area between the CPV cells. In various embodiments, long-wavelength light transmitted by the III-V CPV cells is used by the silicon cell beneath. In some embodiments, the CPV cells may be connected in a two, three, or four terminal configuration.

The disclosed system uses small areas of CPV cells to convert direct sunlight to electricity with high efficiency. The disclosed system can also convert diffuse sunlight from the broad area of the sky away from the sun's disk, both under cloudless skies when the CPV cells have their maximum output and under hazy or overcast skies when the CPV cells have reduced output or are not being used. In general, on-axis direct light can be converted at high efficiencies by the small, distributed CPV cells, while off-axis light (whether due to misalignment of the CPV optics or from diffuse light) can still be used at a lower, but substantial conversion efficiency. The use of a large-scale parallel mounting and interconnection of high-efficiency III-V solar cells on a large-area silicon substrate provides substantial cost advantages over discrete packaging. In addition, other circuit functions, such as bypass and blocking diode protection, monolithic integration, power switching, and heat sinking, can be performed by the large-area silicon substrate on which III-V cells are mounted.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

For the sake of brevity, conventional techniques and components related to photovoltaic cells, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

In at least one preferred embodiment of the present disclosure, multiple small-area high-efficiency AlGaInP/AlGaAs/GaInAs three-junction solar cells are bonded on flat-plate silicon solar cells, to form direct/diffuse (also referred to as direct/off-axis or on-axis/off-axis) light harvesting receivers in hybrid direct/diffuse modules. These hybrid direct/diffuse modules could have a similar form factor as conventional flat-plate silicon modules or one-sun space panels, and can use diffuse or off-axis light as well as direct sunlight. As a result, in terrestrial applications, these modules are projected to provide a greater than fifty percent (50%) higher energy production than the best flat-plate modules currently in use.

FIG. 1 is a diagram 100 depicting the disclosed system for concentrator photovoltaic cells 110 bonded to flat-plate solar cells 120 for direct and off-axis light collection, in accordance with at least one embodiment of the present disclosure. As shown in this figure, an array of solar cells (e.g., silicon (Si) solar cells) 120 are arranged on a flat plate 160. In addition, concentrator photovoltaic cells (e.g., III-V CPV cells) 110 are each bonded on top of at least one of the solar cells 120 in the array. It should be noted that the concentrator photovoltaic cells 110 are each bonded on top of at least one of the solar cells 120 in the array using a bonding that is a conductor or an insulator. In one or more embodiments, the concentrator photovoltaic cells 110 are each bonded on top of at least one of the solar cells 120 in the array using a bonding that is transparent or opaque.

Additionally, metal gridlines 170 are each configured on top of at least one of the solar cells 120 in the array. Each of the concentrator photovoltaic cells 110 are connected to a metal gridline 170. In addition, a lens (e.g., a lens parquet or other primary optical concentrating element) 150 is configured above the array of solar cells 120.

During operation of the disclosed system, the lens 150 receives light from at least one light source (not shown). The light comprises direct light 130 and diffuse light 140. The lens 150 focuses the direct light 130 onto the concentrator photovoltaic cells 110. Also, the lens 150 passes the diffuse light 140 onto the solar cells 120.

Then, the concentrator photovoltaic cells 110 collect the direct light 130. The concentrator photovoltaic cells 110 then covert the direct light 130 into electrical energy.

Also, the solar cells 120 collect diffuse light 140. The solar cells 120 then convert the diffuse light 140 into electrical energy.

In embodiments where the concentrator photovoltaic cells 110 are each bonded on top of at least one of the solar cells 120 in the array using a bonding that is transparent, the solar cells 120 additionally collect direct light 130. For these embodiments, the solar cells 120 then convert the direct light 130 into electrical energy.

As previously mentioned, the small III-V concentrator photovoltaic cells 110 are integrated onto the large-area flat plate 160 comprising an array of solar cells 120 (i.e. a flat-plate silicon platform). Current from the bonded concentrator photovoltaic cells 110 is carried by the metal gridlines (e.g., patterned conductors) 170 on the front surface of the solar cells 120.

In one or more embodiments of this disclosed hybrid CPV/flat-plate system, three-junction AlGaInP/AlGaAs/GaInAs III-V concentrator photovoltaic cells 110 are bonded to a flat-plate silicon platform 120, 160. The III-V concentrator photovoltaic cells 110 convert direct light (e.g., direct radiation) 130 at high efficiency, while diffuse light 140 (or off-axis radiation) is captured by the solar cells 120.

The integration of III-V concentrator photovoltaic cells 110 on the solar cells 120 may be done by bonding with 1) a transparent, electrically insulating adhesive in a baseline configuration. However, the III-V concentrator photovoltaic cell integration may also be done by bonding with: 2) a transparent, electrically conductive adhesive; 3) an opaque, electrically insulating adhesive; 4) an opaque, electrically conductive adhesive; 5) a direct semiconductor-to-semiconductor bond, which may be electrically conducting or insulating, transparent or opaque; 6) oxide or nitride materials, which may be electrically conducting or insulating, transparent or opaque; or 7) other materials between the small III-V concentrator photovoltaic cells 110 and the large-area of solar cells 120 beneath.

Other functions, in addition to photovoltaic power generation, are preferably incorporated in the large-area of solar cells 120 that serves as a bonding substrate for the small III-V concentrator photovoltaic cells 110, such as mechanical support, thermal transport, electrical interconnection, bypass diode and blocking diode protection, power switching circuitry, and other functions.

Large-area one-sun cells other than silicon solar cells 120 may also be used as the bonding substrate for the small III-V concentrator photovoltaic cells 110, such as polycrystalline copper indium diselenide $CuInSe_2$ thin-film solar cells and related compounds, CdTe solar cells, metamorphic GaInAs/Ge 2-junction cells, and others.

These disclosed hybrid direct/diffuse modules (i.e. each module comprises a concentrator photovoltaic cell 110 along with a solar cell(s) 120) would track the sun (e.g. by use of a sun tracker), thereby avoiding the cosine losses of fixed modules in a low-profile array suitable for residential and commercial roof tops, or conventional non-tracking one-sun space solar panels. For terrestrial applications, modules may be designed for high-DNI (direct normal irradiance) areas, or low-DNI areas in which approximately forty percent (40%) of the available power is typically diffuse sunlight, and approximately sixty percent (60%) is direct sunlight.

The disclosed four-junction hybrid direct/diffuse module of the preferred embodiment has a projected efficiency of approximately forty-four percent (44%) under concentration. This high efficiency along with the ability to use diffuse light 140 as well as direct light 130 results in an efficiency of approximately thirty-one percent (31%) for these modules, in terms of energy production over the year.

FIG. 2 is a table 200 showing the calculated energy production and cost metrics of the disclosed system for concentrator photovoltaic cells bonded to flat-plate solar cells for direct and off-axis light collection, in accordance with at least one embodiment of the present disclosure.

It should be noted that conventional flat-plate silicon modules have a fairly low module cost, but the balance-of-system (BOS) costs are much higher. Typical costs (e.g., for the year of 2014) are 0.50 dollars per Watt ($/W) for flat-plate silicon modules with twenty percent (20%) efficiency, and 1.50 $/W BOS costs, for a total cost of 2.00 $/W.

The proposed disclosed hybrid direct/diffuse module design makes innovative use of small areas of III-V multijunction concentrator photovoltaic cells with more than twice the efficiency of the best flat-plate silicon cells, and increases the solar resource available compared to other concentrated photovoltaic (CPV) systems by using diffuse as well as direct sunlight. In general, the proposed hybrid system allows for off-axis light of any kind to be used, rather than completely wasting off-axis light as conventional CPV systems do, whether the off-axis light is due to a tracking error in a terrestrial, space, or laser power converter CPV system, or due to a diffuse light source, such as the sky in terrestrial applications. Off-axis light is defined as light incident on the CPV system primary optics at an angle which is outside the acceptance angle cone for the CPV primary optics.

The use of a three junction (3J) AlGaInP/AlGaAs/GaInAs material for the III-V concentrator photovoltaic cells, located above the silicon solar cells, is an innovation that reduces the cell current by a factor of 2/3 compared with using two junction (2J) GaInP/GaAs concentrator photovoltaic cells, thereby resulting in $(2/3)^2$, or less than half of the resistive power loss of the 2J cells. This is an important advantage for concentrator cells in general.

In addition, the use of 3J concentrator photovoltaic cells located above the silicon solar cells allows for the concentrator photovoltaic cells to be current-matched to the silicon solar cells, thereby opening the possibility for current-matched operation in two terminal or three terminal designs, which offers greater simplicity than the baseline four terminal design, as will be discussed in greater detail below.

The high efficiency and thin (typically less than 5 centimeters (cm) in thickness) module package of the hybrid modules in this disclosure greatly reduces balance-of-systems and installation costs and allows for the use of these hybrid modules in space-constrained applications, such as on residential and commercial rooftops. Due to the high energy density (e.g., efficiency) of the disclosed hybrid direct/diffuse modules, and the resulting reduction of the dominant balance-of-system (BOS) costs, the disclosed hybrid modules may be used for terrestrial applications, thereby enabling an improved penetration of photovoltaic electricity generation in the country.

The calculated energy production and cost metrics of the disclosed hybrid direct/diffuse system are shown in table 200 and are compared to conventional flat-plate silicon solar cell systems. For the calculations, an energy resource that is forty percent (40%) diffuse was used, and sixty percent (60%) direct sunlight was used, as were a 0.50 $/W conventional silicon module cost (100 $/m² for a twenty percent (20%) module) with 0.007 $/cm² silicon cell cost, and 4.0 $/cm² epitaxial III-V concentrator photovoltaic cell cost.

Note from the table 200 that the solar energy harvesting efficiency over the year is projected to be thirty-one percent (31%) for the proposed hybrid direct/diffuse modules, compared to 20% for state-of-the-art silicon flat-plate modules. Due to the longevity of the high quality semiconductor devices and packaging used in this system, degradation of the proposed system is projected to be less than one percent (1%) per year. Factoring in this efficiency of energy production over the year, module production cost per unit collector area, and BOS costs, the projected cost per watt for the disclosed hybrid module design is significantly lower at 1.44 $/W than for conventional flat-plate silicon modules at 2.00 $/W.

Preferred Embodiments

Figure 3:
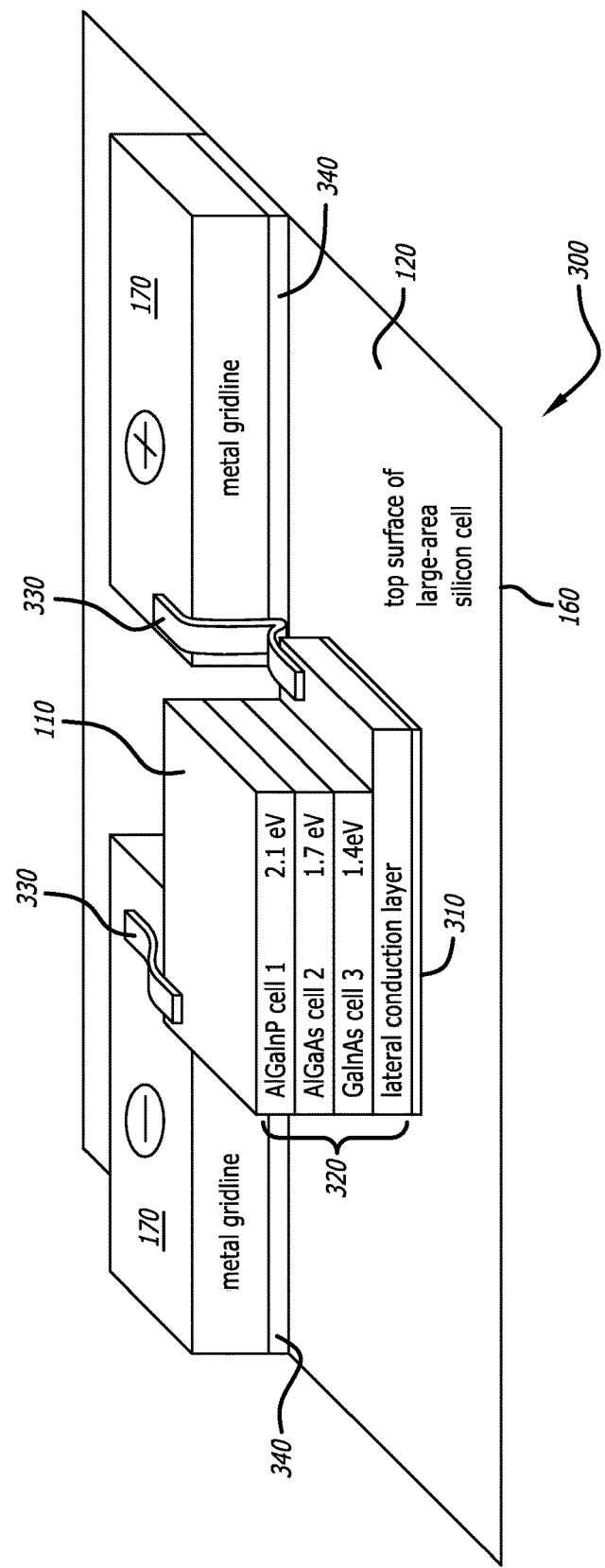
FIG. 3 is a detailed diagram depicting a method to integrate a concentrator photovoltaic cell with a flat-plate solar cell construction that may be employed by the disclosed system for concentrator photovoltaic cells bonded to flat-plate solar cells for direct and off-axis light collection, in accordance with at least one embodiment of the present disclosure.

FIG. 3 is a detailed diagram depicting a method to integrate a concentrator photovoltaic cell with a flat-plate solar cell construction that may be employed by the disclosed system for concentrator photovoltaic cells bonded to flat-plate solar cells for direct and off-axis light collection, in accordance with at least one embodiment of the present disclosure. The following are characteristics for preferred embodiments of the disclosed hybrid direct/diffuse modules. For preferred embodiments, the bonding 310 used to bond the concentrator photovoltaic cells 110 to the solar cells 120 is transparent, thereby allowing light to reach the solar cells 120 during concentrator operation and thereby forming four junction concentrator photovoltaic cells 320 (e.g., four junction AlGaInP/AlGaAs/GaInAs/Si concentrator photovoltaic cells).

Over one-hundred (100) III-V concentrator photovoltaic cells 110 of approximately 0.5 mm on a side are lifted off of their epitaxial growth substrate and bonded on a standard 210 millimeter (mm)×210 mm flat-plate silicon platform comprising silicon solar cells 120 and a flat plate 160.

Electrical connections to the three junction III-V concentrator photovoltaic cells 110 are formed with metal gridlines 170, via two terminals 330, on the silicon solar cells 120 of the flat-plate silicon platform, thereby making use of an electrical isolation layer 340 beneath the metal gridlines 170. A diagram of one III-V/Si cell configuration is shown in FIG. 3, in which light is transmitted through the III-V concentrator photovoltaic cell 110 stack to reach the large-area silicon solar cells 120 of the flat-plate silicon platform beneath, and the concentrator photovoltaic cells 110 are connected in a series string via the metal gridlines 170.

The electrical connections to the three junction III-V concentrator photovoltaic cells 110 may be made in the same areas as existing metal gridlines 170 on the silicon solar cells 120 of the flat-plate silicon platform to avoid additional shadowing, using a bi-layer metallization technology.

The electrical connections to the three junction III-V concentrator photovoltaic cells 110 and silicon solar cells 120 of the flat-plate silicon platform may be made in a four terminal configuration, thereby removing the need for current matching between III-V concentrator photovoltaic cells 110 and the silicon solar cells 120 under differing diffuse light conditions, or in a three terminal configuration, or in a two terminal current-matched configuration.

Active switching of cell circuits may be used, for instance to include or exclude the III-V concentrator photovoltaic circuit from the silicon solar cell circuit during different light conditions.

III-V concentrator photovoltaic cell circuits and silicon solar cell circuits are combined in series-parallel configurations using voltage matching rather than current matching, thereby avoiding the need for power modification devices to combine outputs from the III-V cell and silicon solar cell circuits.

Alternative low-bandgap solar cells other than the large-area silicon solar cells for the solar cells 120 may be used, for instance, Ge, Si, SiGe, GaInNAs, metamorphic GaInAs, lattice-matched GaInAs, GaInPAs, AlGaInAs, metamorphic GaInAs/Ge 2J, Ge/Ge 2J, GaInPAs/GaInAs 2J, AlGaInAs/GaInAs 2J, or other cells may be used, in discrete small-area, large-area, substrate-removed-epitaxial-film, or on-substrate cell formats.

Alternative high-bandgap solar cells other than the three junction AlGaInP/AlGaAs/GaInAs cell combination for the concentrator photovoltaic cells 110 may be used, for instance, GaInP, AlGaInP, GaAs, AlGaAs, AlGaInAs, GaInPAs, GaInN, AlGaInN, (Al)GaInP/Ga(In)As two junction (2J), AlGa(In)As/Ga(In)As 2J, AlGaInP/AlGaAs/AlGaInAs three junction (3J), AlGaInP/GaInP/AlGaAs/GaInAs four junction (4J), or other cells may be used, in discrete small-area, large-area, substrate-removed-epitaxial-film, or on-substrate cell formats.

Mechanical support, thermal transport, electrical connection, bypass diode protection, blocking diode protection, and/or power switching circuitry for the III-V concentrator photovoltaic cells 110 can be formed in the large-area silicon solar cells 120 of the flat-plate silicon platform, thereby eliminating the cost of individual cell mounts and providing a high degree of cell integration on the 210 mm×210 mm flat-plate silicon platform.

Alternative Approaches

The advantages of the hybrid direct/diffuse modules over conventional flat-plate photovoltaic (PV) systems in terms of harvesting efficiency and cost per watt have been discussed above. Another potential approach for low-cost-per-watt residential and commercial PV are concentrator photovoltaic systems that do not incorporate active silicon cells to capture diffuse sunlight. Such systems must still employ an electrically insulating, thermally conductive mount of some kind to provide mechanical support, heat sinking, electrical isolation from the module housing, and electrical interconnection to the cell circuit. Such cell mounts are typically a ceramic chip with patterned metal traces, and in the hybrid direct/diffuse module, this function is served by the active large-area silicon solar cells of the flat-plate silicon platform. Even if this packaging element in a concentrator photovoltaic-only system is ignored, the cost per watt is somewhat higher (projected at 1.60 $/W) than for the hybrid system (1.44 $/W) due to the loss of the diffuse light component in the concentrator photovoltaic-only case, though it is still lower than conventional flat-plate PV (2.00 $/W installed system cost). In fact, the cost of discrete ceramic chip packaging elements have significant cost, and increase the cost of a conventional concentrator photovoltaic-only system above 1.60 $/W. Furthermore, the hybrid system delivers power every day, again due to its ability to collect diffuse light, so its supply of power is more continuous.

Multijunction Cell Configurations

An important aspect of the multijunction cell configuration is the nature of the low-bandgap bottom cell or cells in the multijunction concentrator photovoltaic cell. In the baseline case, the low bandgap cell is the large-area silicon solar cell forming cell 4 (bottom cell) in a four junction (4J) AlGaInP/AlGaAs/GaInAs//Si cell (refer to 320 of FIG. 3).

Two general approaches can be identified: Approach 1 in which the concentrator photovoltaic cells have opaque back contacts, and do not transmit light to the large-area silicon solar cells of the flat-plate silicon platform; and Approach 2 in which the concentrator photovoltaic cells and their bond are transparent and do transmit light to the large-area active silicon solar cell beneath.

Potential configurations of Approach 1 include bonding monolithically-grown four junction AlGaInP/AlGaAs/GaInAs/Ge cells (also referred to as C123/Ge cells, where the upper AlGaInP/AlGaAs/GaInAs cell combination is referred to as C123) on the active large-area silicon solar cells of the flat-plate silicon platform. Another Approach 1 configuration includes C123/Si cells, in which the C123 top three junction cell combination is bonded onto a silicon concentrator cell with 3-10 times larger area, which is then in turn bonded on the large-area silicon solar cells of the flat-plate silicon platform. An additional Approach 1 configuration is a C123/1.0-eV GaInNAs structure, with a dilute nitride GaInNAs bottom cell 4.

Approach 2 (refer to FIG. 3) allows for the elegant solution of using the active large-area silicon solar cell 120 as the bottom cell of the four junction stack 320. In this case, a highly transparent adhesive layer (e.g., bonding 310) may be used to bond the upper C123 cells of the concentrator photovoltaic cell 110 to the bottom silicon solar cell 120. A schematic diagram of concentrator photovoltaic cells 110 that have been lifted off of their epitaxial growth substrate and bonded to the large-area silicon solar cell 120 is shown in FIG. 3. A four junction AlGaInP/AlGaAs/GaInAs//Si cell configuration 320 is shown in the figure. In any of these configurations, a substantial amount of circumsolar radiation outside the collection cone for the III-V concentrator photovoltaic cell 110 may be collected by the bottom silicon solar cell 120. The baseline Approach 2 configuration in FIG. 3 is for a transparent bond (i.e. wherein a transparent bonding 310 is used) between the small III-V concentrator photovoltaic cells 110 and the active large-area silicon solar cell 120 beneath, such that the large-area silicon solar cell 120 forms the bottom cell of the bonded multijunction cell 320. Approach 2 offers advantages for lower cost and higher efficiency compared to designs in Approach 1.

Cell Interconnection Configurations

A four terminal cell interconnection configuration is shown in FIG. 3: two electrically isolated terminals 330 for the upper concentrator photovoltaic cells 110, and two more terminals (not shown) for the bottom large-area silicon solar cell 120. Configurations with 3 or 2 terminals can also be used, as described below. A technically challenging aspect of the hybrid direct/diffuse module is getting the current of the small concentrator photovoltaic cells 110 off of the silicon solar cells 120 of the flat-plate silicon platform. In the baseline approach, separate metal conductors for the concentrator photovoltaic circuit are deposited on the front surface of the silicon solar cell 120 by screen printing, sputtering, or other high-throughput metallization process. This approach requires a dielectric insulator to be placed between the metal traces and the emitter of the silicon solar cell 120. For example, strings of 14 concentrator photovoltaic cells 110 may be connected in series across the twenty-one (21) cm dimension of a standard large-area flat-plate silicon platform. This can be done with a single metal grid line 170, with about approximately 0.14 percent (%) relative resistive power loss, and approximately 0.7% shadowing loss on the silicon solar cell 120. Compared to the approximately ninety-four percent (94%) gain in power due to the higher efficiency of the III-V concentrator photovoltaic cells 110, including the lower optical efficiency of the concentrator photovoltaic system, this is a totally acceptable loss.

In some cases the dielectric insulator may breakdown under the approximately 70 volts (V) built up in a series string of 14 concentrator photovoltaic cells 110 delivering approximately 5 V each. To circumvent this risk, the concentrator photovoltaic cells 110 may also be connected in parallel. This can be accomplished with metal gridlines on the front surface of the silicon solar cells 120 with approximately 2% relative resistive power loss, and approximately 5% shadowing loss on the silicon solar cells 120. Particularly since the silicon solar cells 120 contribution to energy harvesting is smaller than the concentrator photovoltaic circuit (25% from silicon solar cells 120 versus 75% from the concentrator photovoltaic cells 110 in regions with 40% diffuse light); this is again an acceptable loss to the total energy delivered by the hybrid module.

The conductors for the concentrator photovoltaic circuit may coexist with the standard gridded front contact of the large-area silicon solar cells, or both silicon solar cell contacts may be placed on the rear of the silicon solar cell as in a back-contact solar cell so that the concentrator photovoltaic circuit is the only metallization on the front surface of the silicon solar cell.

In alternative cell interconnection approaches, the III-V concentrator photovoltaic cells may be connected to the large-area silicon solar cell using three terminal and two terminal designs. In one such configuration, the back contacts of the concentrator photovoltaic cells are connected to the existing front grid of the silicon solar cells, resulting in a total of three terminals. Under normal direct light operation, the upper three III-V concentrator photovoltaic cells are designed for current balance with the large-area silicon solar cells beneath, which collect a combination of direct, concentrated light in points across the cell that is transmitted through the upper three III-V concentrator photovoltaic cells, and diffuse light across the rest of the silicon solar cells. In this case, current flows through the top contact of the concentrator photovoltaic cell (terminal 1), and out the bottom contact of the silicon solar cell (terminal 3) in a current-matched configuration. Although this is a three terminal design, current flows through just two terminals under these conditions (i.e. a two terminal operation). Under diffuse light conditions when there is negligible or no direct light, smart circuitry in the module would switch to the top contact of the silicon solar cell (terminal 2), thereby taking the concentrator photovoltaic cells out of the circuit. In this diffuse light case, the operation would again be two terminal, but using the front and back contacts of the silicon solar cell as the two terminals.

Figure 4:
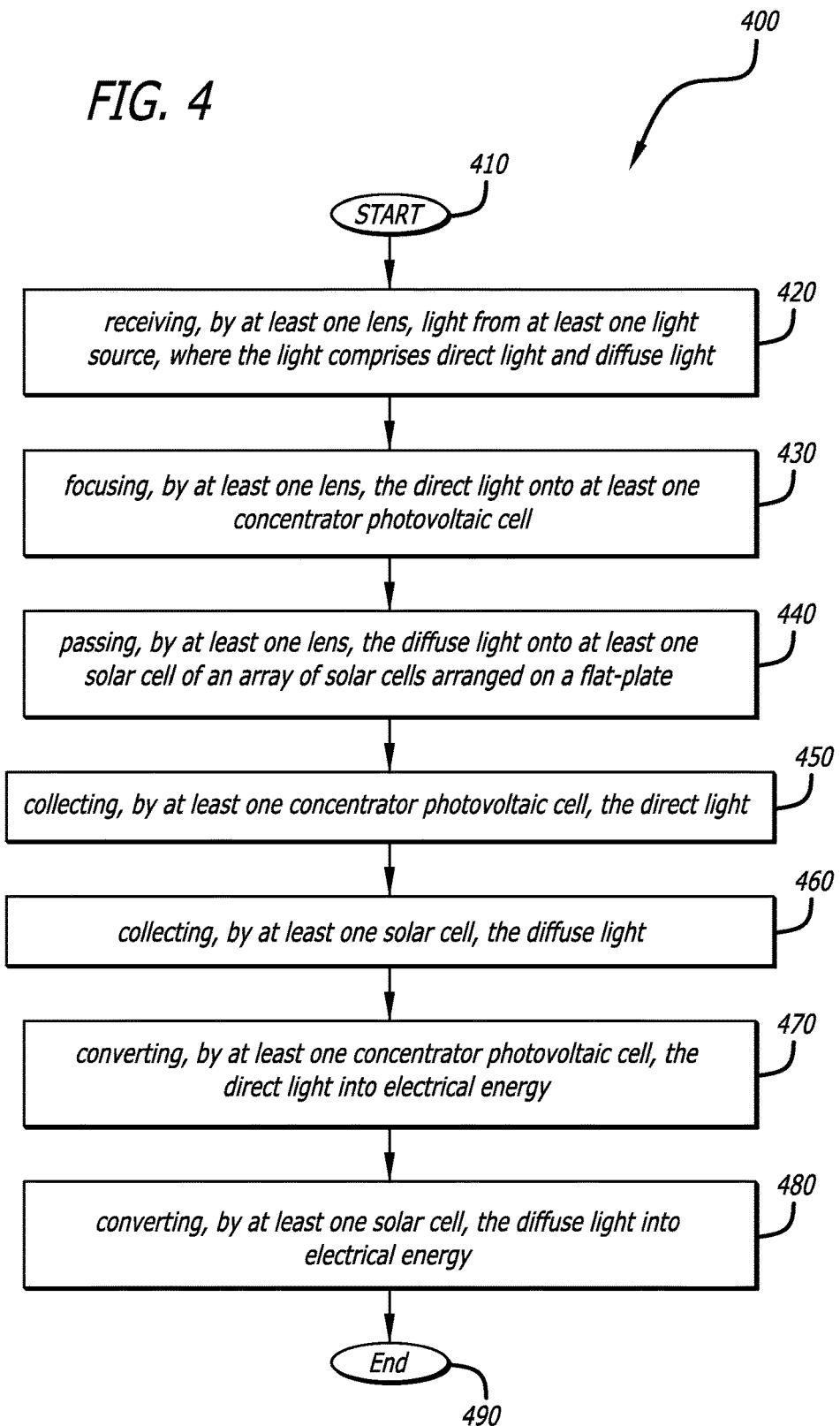
FIG. 4 is a flow chart depicting the disclosed method for concentrator photovoltaic cells bonded to flat-plate solar cells for direct and off-axis light collection, in accordance with at least one embodiment of the present disclosure.

FIG. 4 is a flow chart depicting the disclosed method 400 for concentrator photovoltaic cells bonded to flat-plate solar cells for direct and off-axis light collection, in accordance with at least one embodiment of the present disclosure. At the start 410 of the method 400, at least one lens receives light from at least one light source, where light comprises direct light and diffuse light 420. At least one lens focuses the direct light onto at least one concentrator photovoltaic cell 430. At least one lens passes the diffuse light onto at least one solar cell of an array of solar cells arranged on a flat plate 440.

Then, at least one concentrator photovoltaic cell collects the direct light 450. At least one solar cell collects the diffuse light 460. At least one concentrator photovoltaic cell converts the direct light into electrical energy 470. At least one solar cell converts the diffuse light into electrical energy. Then, the method 400 ends 490.

Figure 5:
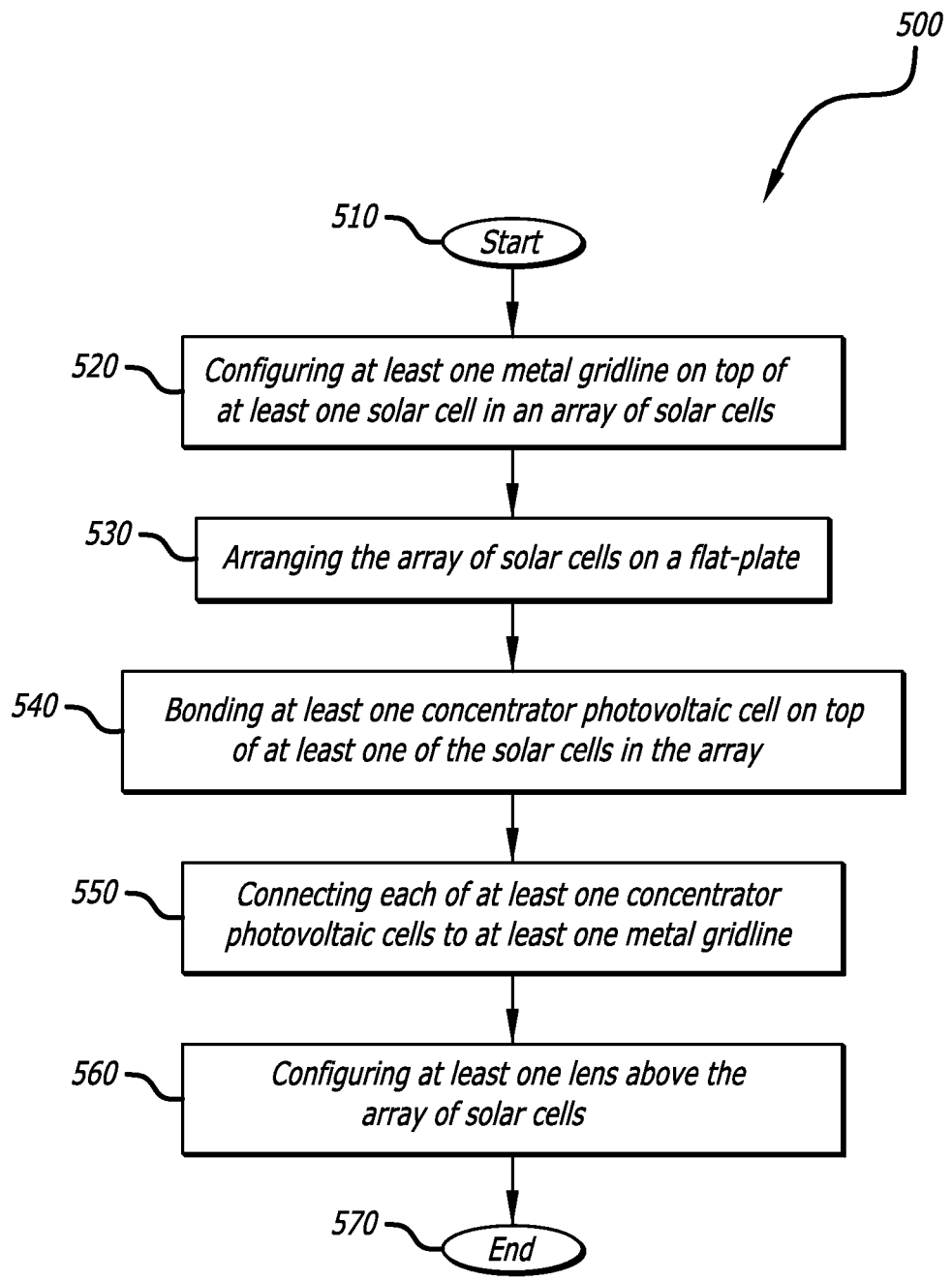
FIG. 5 is a flow chart depicting the disclosed method of manufacturing concentrator photovoltaic cells bonded to flat-plate solar cells for direct and off-axis light collection, in accordance with at least one embodiment of the present disclosure.

FIG. 5 is a flow chart depicting the disclosed method 500 of manufacturing concentrator photovoltaic cells bonded to flat-plate solar cells for direct and off-axis light collection, in accordance with at least one embodiment of the present disclosure. At the start 510 of the method 500, at least one metal gridline is configured on top of at least one solar cell in an array of solar cells 520. Then, the array of solar cells is arranged on a flat plate 530. At least one concentrator photovoltaic cell is bonded on top of at least one of the solar cells in the array 540. Each of the concentrator photovoltaic cells is connected to at least one metal gridline 550. At least one lens is configured above the array of solar cells 560. Then, the method 500 ends 570.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

For example, while certain embodiments are described with products in the form of computer program products embodied in a non-transitory computer readable medium such as a software product, embodiments may also involve products in the form of tangible goods or services that are consumed by individuals and corporate and government entities.

As a further example, embodiments may involve a sensor application that is a stand alone application, which may contain one or more programs, or that is part of another system or program.

Although particular embodiments have been shown and described, it should be understood that the above discussion is not intended to limit the scope of these embodiments. While embodiments and variations of the many aspects of the present disclosure have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for light collection and conversion to electricity, the method comprising:

receiving, by at least one concentrating element, light from at least one light source, wherein the light comprises direct light and diffuse light;

directly focusing, by the at least one concentrating element, the direct light onto at least one concentrator photovoltaic cell;

passing, by the at least one concentrating element, the diffuse light onto at least one solar cell of an array of solar cells arranged on a flat plate, wherein the at least one concentrator photovoltaic cell is directly bonded to at least one of the solar cells in the array;

collecting, by the at least one concentrator photovoltaic cell, the direct light;

transmitting, by the at least one concentrator photovoltaic cell, at least a portion of the direct light through the at least one concentrator photovoltaic cell directly to at least one of the at least one solar cell;

collecting, by the at least one solar cell, the diffuse light and at least a portion of the direct light;

converting, by the at least one concentrator photovoltaic cell, at least a portion of the direct light into electrical energy; and converting, by the at least one solar cell, the diffuse light and at least a portion of the direct light the at least one solar cell collected into electrical energy, wherein the at least one concentrator photovoltaic cell comprises multiple layers, which comprise a conduction layer and at least two cell layers, wherein at least two external metal gridlines are configured on top of at least one of the solar cells in the array, and wherein a first end of each of at least two terminals is connected to a respective one of the at least two external metal gridlines, a second end of at least one of the terminals is connected to the conduction layer, and a second end of at least one other of the terminals is connected to one of the cell layers.

2. The method of claim 1, wherein the at least one concentrating element is a lens parquet.

3. The method of claim 1, wherein the at least one concentrator photovoltaic cell is manufactured from at least one III-V material.

4. The method of claim 3, wherein the at least one III-V material is at least one of GaInP, AlGaInP, GaAs, AlGaAs, AlGaInAs, GaInPAs, GaInN, AlGaInN, (Al)GaInP/Ga(In)As two junction (2J), AlGa(In)As/Ga(In)As 2J, AlGaInP/AlGaAs/AlGaInAs three junction (3J), or AlGaInP/GaInP/AlGaAs/GaInAs four junction (4J).

5. The method of claim 1, wherein the at least one concentrator photovoltaic cell is bonded on top of at least one of the solar cells by utilizing a bonding layer that is transparent.

6. The method of claim 1, wherein the at least one concentrator photovoltaic cell is bonded on top of at least one of the solar cells by utilizing a bonding that is one of a conductor or an insulator.

7. The method of claim 1, wherein the solar cells in the array are manufactured from at least one of Ge, Si, SiGe, GaInNAs, metamorphic GaInAs, lattice-matched GaInAs, GaInPAs, AlGaInAs, metamorphic GaInAs/Ge two junction (2J), Ge/Ge 2J, GaInPAs/GaInAs 2J, or AlGaInAs/GaInAs 2J.

8. A system for light collection and conversion to electricity, the system comprising:

at least one concentrating element configured to receive light, which comprises direct light and diffuse light, from at least one light source, to focus the direct light directly onto at least one concentrator photovoltaic cell, and to pass the diffuse light onto at least one solar cell of an array of solar cells arranged on a flat plate, wherein the at least one concentrator photovoltaic cell is directly bonded to at least one of the solar cells in the array;

the at least one concentrator photovoltaic cell configured to collect the direct light, and configured to transmit at least a portion of the direct light through the at least one concentrator photovoltaic cell directly to at least one of the at least one solar cell, and to convert at least a portion of the direct light into electrical energy, wherein the at least one concentrator photovoltaic cell comprises multiple layers, which comprise a conduction layer and at least two cell layers;

the at least one solar cell configured to collect the diffuse light and at least a portion of the direct light, and to convert the diffuse light and at least a portion of the direct light the at least one solar cell collected into electrical energy;

at least two external metal gridlines configured on top of at least one of the solar cells in the array; and at least two terminals, wherein a first end of each of the at least two terminals is connected to a respective one of the at least two external metal gridlines, a second end of at least one of the terminals is connected to the conduction layer, and a second end of at least one other of the terminals is connected to one of the cell layers.

9. The system of claim 8, wherein the at least one concentrating element is a lens parquet.

10. The system of claim 8, wherein the at least one concentrator photovoltaic cell is manufactured from at least one III-V material.

11. The system of claim 10, wherein the at least one III-V material is at least one of GaInP, AlGaInP, GaAs, AlGaAs, AlGaInAs, GaInPAs, GaInN, AlGaInN, (Al)GaInP/Ga(In)As two junction (2J), AlGa(In)As/Ga(In)As 2J, AlGaInP/AlGaAs/AlGaInAs three junction (3J), or AlGaInP/GaInP/AlGaAs/GaInAs four junction (4J).

12. The system of claim 8, wherein the at least one concentrator photovoltaic cell is bonded on top of at least one of the solar cells by utilizing a bonding layer that is transparent.

13. The system of claim 8, wherein the at least one concentrator photovoltaic cell is bonded on top of at least one of the solar cells by utilizing a direct semiconductor-to-semiconductor bond.

14. The system of claim 8, wherein the at least one concentrator photovoltaic cell is bonded on top of at least one of the solar cells by utilizing a bonding that is one of a conductor or an insulator.

15. A method for manufacturing the system for light collection and conversion to electricity of claim 8, the method comprising:
configuring the at least two external metal gridlines on top of the at least one solar cell in the array of solar cells;
arranging the array of solar cells on the flat plate;
directly bonding the at least one concentrator photovoltaic cell on top of at least one of the solar cells in the array;
connecting the at least one concentrator photovoltaic cell to at least two of the external metal gridlines; and
configuring the at least one concentrating element above the array of solar cells.

16. The system of claim 8, wherein the solar cells in the array are manufactured from at least one of Ge, Si, SiGe, GaInNAs, metamorphic GaInAs, lattice-matched GaInAs, GaInPAs, AlGaInAs, metamorphic GaInAs/Ge two junction (2J), Ge/Ge 2J, GaInPAs/GaInAs 2J, or AlGaInAs/GaInAs 2J.

17. The method of claim 1, wherein the at least one concentrator photovoltaic cell is bonded on top of at least one of the solar cells by utilizing a direct semiconductor-to-semiconductor bond.

18. The system of claim 8, wherein at least one of the at least two external metal gridlines is configured to operate as an anode, and at least one other of the at least two external metal gridlines is configured to operate as a cathode.

19. The method of claim 1, wherein at least one of the at least two external metal gridlines operates as an anode, and at least one other of the at least two external metal gridlines operates as a cathode.

20. The method of claim 1, wherein the at least two external metal gridlines are deposited on top of the at least one of the solar cells in the array via one of screen printing or sputtering.

* * * * *